(12) United States Patent
Yoshida et al.

(10) Patent No.: US 11,899,365 B2
(45) Date of Patent: *Feb. 13, 2024

(54) PHOTOSENSITIVE SILOXANE COMPOSITION AND PATTERN FORMING METHOD USING THE SAME

(71) Applicant: Merck Patent GmbH, Darmstadt (DE)

(72) Inventors: Naofumi Yoshida, Yokohama (JP); Takashi Fuke, Kakegawa (JP); Megumi Takahashi, Kakegawa (JP); Katsuto Taniguchi, Kakegawa (JP); Toshiaki Nonaka, Tokyo (JP)

(73) Assignee: Merck Patent GmbH, Darmstadt (DE)

( * ) Notice: Subject to any disclaimer, the term of this patent is extended or adjusted under 35 U.S.C. 154(b) by 664 days.

This patent is subject to a terminal disclaimer.

(21) Appl. No.: 16/958,866

(22) PCT Filed: Dec. 27, 2018

(86) PCT No.: PCT/EP2018/097012
§ 371 (c)(1),
(2) Date: Jun. 29, 2020

(87) PCT Pub. No.: WO2019/129802
PCT Pub. Date: Jul. 4, 2019

(65) Prior Publication Data
US 2021/0055657 A1    Feb. 25, 2021

(30) Foreign Application Priority Data
Dec. 28, 2017  (JP) ................. 2017-254505

(51) Int. Cl.
*G03F 7/075* (2006.01)
*C08G 77/00* (2006.01)
*G03F 7/40* (2006.01)

(52) U.S. Cl.
CPC ........... *G03F 7/0757* (2013.01); *C08G 77/80* (2013.01); *G03F 7/40* (2013.01)

(58) Field of Classification Search
CPC ........ G03F 7/0757; G03F 7/40; G03F 7/0233; G03F 7/0755; G03F 7/0382; G03F 7/20; G03F 7/26; C08G 77/80; C08G 77/04; C08L 83/04
See application file for complete search history.

(56) References Cited

U.S. PATENT DOCUMENTS

| 9,817,312 | B2 | 11/2017 | Yoshida et al. |
| 11,467,494 | B2 * | 10/2022 | Fuke ............... G03F 7/0757 |
| 2010/0092895 | A1 * | 4/2010 | Zhang ............... H01L 21/02216 |
| | | | 525/477 |
| 2010/0178620 | A1 | 7/2010 | Dei et al. |
| 2015/0323868 | A1 | 11/2015 | Huang et al. |

FOREIGN PATENT DOCUMENTS

| WO | WO-2015060155 A1 | 4/2015 |
| WO | WO-2016146896 A1 | 9/2016 |
| WO | WO-2017090917 A1 | 6/2017 |
| WO | WO-2019063460 A1 | 4/2019 |

OTHER PUBLICATIONS

International Search Report for PCT/EP2018/097012 dated May 29, 2018.
Written Opinion of the International Searching Authority for PCT/EP2018/097012 dated May 29, 2018.

* cited by examiner

*Primary Examiner* — Su C Kim
(74) *Attorney, Agent, or Firm* — Faegre Drinker Biddle & Reath LLP

(57) ABSTRACT

To provide a photosensitive siloxane composition capable of forming a pattern having a desired taper angle and a desired linewidth.

[Means] The present invention provides a photosensitive siloxane composition comprising: a polysiloxane having a structure represented by the following formula (ia'): (L is an alkylene or phenylene), a photoactive agent, and a solvent.

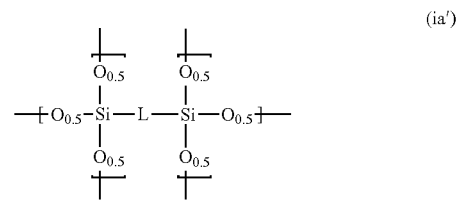

20 Claims, No Drawings

PHOTOSENSITIVE SILOXANE COMPOSITION AND PATTERN FORMING METHOD USING THE SAME

CROSS-REFERENCE TO RELATED APPLICATIONS

This application is a national stage application (under 35 U.S.C. § 371) of PCT/EP2018/097012, filed Dec. 27, 2018, which claims benefit of Japanese Application No. 2017-254505, filed Dec. 28, 2017, both of which are incorporated herein by reference in their entirety.

BACKGROUND OF THE INVENTION

Technical Field

The present invention relates to a photosensitive siloxane composition. Further, this invention also relates to a cured film using the same and a device using the same.

Background Art

In recent years, various proposals have been made for further improving light utilization efficiency and energy saving in optical devices such as displays, light emitting diodes and solar cells. For example, in a liquid crystal display, a method is known in which a transparent planarization film is formed by coating on a TFT device and pixel electrodes are formed on the planarization film to increase the aperture ratio of the display device.

As the material for such a planarization film on a TFT substrate, a material comprising a combination of an acrylic resin and a quinonediazide compound is known. Since these materials have planarization properties and photosensitivity, contact holes and other patterns can be made. However, with improvement of the resolution and the frame frequency, the wiring becomes more complicated, so that planarization becomes more severe, and it becomes difficult to be dealt by these materials.

Polysiloxane is known as a material for forming a cured film with high heat resistance, high transparency and high resolution. In particular, silsesquioxane derivatives have been widely used due to their excellent low dielectric constant, high transmittance, high heat resistance, UV resistance, and coating uniformity.

Silsesquioxane is a polymer composed of a trifunctional siloxane structural unit $RSi(O_{1.5})$, which is an intermediate between inorganic silica ($SiO_2$) and organic silicone ($R_2SiO$) in terms of chemical structure, but while it is soluble in organic solvent, the cured product obtained therefrom is a specific compound showing a characteristic high heat resistance which is similar to inorganic silica. When a pattern is formed from a photosensitive composition, the wall of the formed pattern is required to have a taper angle meeting a particular need. Specifically, for example, if the pattern has a circular opening hole, the hole may be preferred to be not cylindrical but truncated conical or reverse truncated conical in some cases. In those cases, if the photosensitive composition is of positive type, the angle of the inclined wall, namely, the taper angle is often adjusted by controlling the contents of the additives, such as, photo acid generators. However, that method has problems, such as, contamination with impurities, deterioration of electric properties, and increase in cost. Accordingly, it has been desired to provide a method capable of solving those problems.

PRIOR ART DOCUMENTS

Patent Documents

[Patent document 1] WO 2015/060155

SUMMARY OF THE INVENTION

Problem to be Solved by the Invention

An object of the present invention is to provide a photosensitive siloxane composition which can form a pattern having a desired taper angle and a desired line width.

Means for Solving Problem

The photosensitive siloxane composition according to the present invention comprises:
a polysiloxane (Pa)
which contains a repeating unit represented by the following formula (ia):

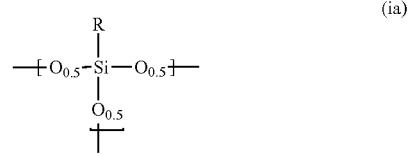

(ia)

wherein
R is hydrogen, a monovalent to trivalent, linear, branched or cyclic, saturated or unsaturated $C_{1-30}$ aliphatic hydrocarbon group, or a monovalent to trivalent $C_{6-30}$ aromatic hydrocarbon group,
in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, or one or more carbons are unsubstituted or substituted with silicon,
when R is divalent or trivalent, R connects Si atoms contained in a plurality of repeating units, and
all or part of said repeating units form a structure represented by the following formula (ia'):

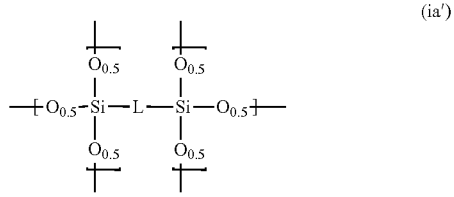

(ia')

wherein
L is —$(CR'_2)_n$— or

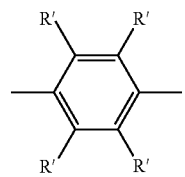

provided that n is an integer of 1 to 3, and each R' is independently hydrogen, methyl or ethyl;

a photoactive agent; and a solvent.

Further, the pattern forming method according to the present invention is characterized by applying the above photosensitive siloxane composition on a substrate and then heating it.

Effects of the Invention

According to the photosensitive siloxane composition of the present invention, it is possible to control the taper angle of the formed pattern. Specifically, in the course of forming the pattern, the pattern linewidth changes so little when heated to cure that the taper angle can be controlled to form a desired pattern easily. Further, the obtained cured film has excellent properties, such as, hardness and transparency.

DETAILED DESCRIPTION OF THE INVENTION

Mode for Carrying Out the Invention

Embodiments of the present invention are described in detail below. Hereinafter, symbols, units, abbreviations and terms have the following meanings unless otherwise specified.

In the present specification, when numerical ranges are indicated using "to", they include both endpoints, and units thereof are common. For example, 5 to 25 mol % means 5 mol % or more and 25 mol % or less In the present specification, the hydrocarbon means one which includes carbon and hydrogen, and optionally oxygen or nitrogen. The hydrocarbon group means a monovalent or divalent or more valent hydrocarbon.

In the present specification, the aliphatic hydrocarbon means a linear, branched or cyclic aliphatic hydrocarbon, and the aliphatic hydrocarbon group means a monovalent or divalent or more valent aliphatic hydrocarbon. The aromatic hydrocarbon means a hydrocarbon containing an aromatic ring which may have an aliphatic hydrocarbon group as a substituent or may be optionally condensed with an aliphatic ring. The aromatic hydrocarbon group means a monovalent or divalent or more valent aromatic hydrocarbon. These aliphatic hydrocarbon group and aromatic hydrocarbon group optionally contain fluorine, oxy, hydroxy, amino, carbonyl or silyl and the like. In addition, the aromatic ring means a hydrocarbon having a conjugated unsaturated ring structure, and the aliphatic ring means a hydrocarbon having a ring structure but no conjugated unsaturated ring structure.

In the present specification, the alkyl means a group obtained by removing one arbitrary hydrogen from a linear or branched saturated hydrocarbon, including linear alkyl and branched alkyl, and the cycloalkyl means a group obtained by removing one hydrogen from a saturated hydrocarbon containing a cyclic structure, and optionally including a linear or branched alkyl as a side chain in a cyclic structure.

In the present specification, the aryl means a group obtained by removing one arbitrary hydrogen from an aromatic hydrocarbon. The alkylene means a group obtained by removing two arbitrary hydrogens from a linear or branched saturated hydrocarbon. The arylene means a hydrocarbon group obtained by removing two arbitrary hydrogens from an aromatic hydrocarbon.

In the present specification, the descriptions such as "$C_{x-y}$", "$C_x$-$C_y$" and "C." mean the number of carbons in the molecule or substituent. For example, $C_{1-6}$ alkyl means alkyl having 1 or more and 6 or less carbons (methyl, ethyl, propyl, butyl, pentyl, hexyl etc.). In the present specification, the fluoroalkyl refers to one in which one or more hydrogens in alkyl are replaced with fluorine, and the fluoroaryl refers to one in which one or more hydrogens in aryl are replaced with fluorine.

In the present specification, when polymer has plural types of repeating units, these repeating units copolymerize. These copolymerizations may be any of alternating copolymerization, random copolymerization, block copolymerization, graft copolymerization, or a mixture thereof.

In the present specification, % represents mass %, and the ratio represents mass ratio.

In the present specification, Celsius is used as the temperature unit. For example, 20 degrees means 20 degrees Celsius.

<Photosensitive Siloxane Composition>

The photosensitive siloxane composition according to the present invention (hereinafter simply referred to as "composition") comprises:

(I) a polysiloxane having a specific structure (Pa), (II) a photoactive agent, and (III) a solvent.

These components are respectively described below.

[(I) Polysiloxane]

The polysiloxane refers to a polymer having a main chain of Si—O—Si bond (siloxane bond). In the present specification, the polysiloxane shall also include a silsesquioxane polymer represented by the general formula $(RSiO_{1.5})_n$.

The composition of the present invention comprises one or more polysiloxanes. They are individually described below.

(1) Polysiloxane (Pa)

A polysiloxane (Pa) used in the present invention firstly comprises a repeating unit represented by the following formula (ia):

$$\begin{array}{c} R \\ | \\ -\!\!\!+\!\!O_{0.5}\!-\!Si\!-\!O_{0.5}\!+\!\!\!- \\ | \\ O_{0.5} \\ + \end{array} \quad \text{(ia)}$$

wherein

R is hydrogen, a monovalent to trivalent, linear, branched or cyclic, saturated or unsaturated $C_{1-30}$ aliphatic hydrocarbon group, or a monovalent to trivalent $C_{6-30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, or one or more carbons are unsubstituted or substituted with silicon, when R is divalent or trivalent, R connects Si atoms contained in a plurality of repeating units.

In the general formula (ia), when R is a monovalent group, examples of R include (i) alkyl such as methyl, ethyl, propyl, butyl, pentyl, hexyl, heptyl, octyl and decyl, (ii) aryl such as phenyl, tolyl and benzyl, (iii) fluoroalkyl such as trifluoromethyl, 2,2,2-trifluoroethyl and 3,3,3-trifluoropropyl, (iv) fluoroaryl, (v) cycloalkyl such as cyclohexyl, (vi) N-containing group having an amino or an imide structure such as isocyanate and amino, (vii) O-containing group having an epoxy structure such as glycidyl, or an acryloyl or a methacryloyl structure. Preference is given to methyl, ethyl, propyl, butyl, pentyl, hexyl, phenyl, tolyl, glycidyl and isocyanate. As fluoroalkyl, perfluoroalkyl is preferred, especially trifluoromethyl and pentafluoroethyl are preferred. Compounds in which R is methyl are preferred, because raw materials thereof are easily obtained, and they have high film hardness after curing and have high chemical resistance. In addition, phenyl is preferred because it increases solubility of the polysiloxane in the solvent and the cured film is less prone to cracking. When $R^1$ has hydroxy, glycidyl, isocyanate, or amino, adhesiveness with the substrate is improved, which is preferable.

Further, when R is a divalent or trivalent group, R is preferably, for example, (i) a group obtained by removing two or three hydrogens from alkane such as methane, ethane, propane, butane, pentane, hexane, heptane, octane and decane, (ii) a group obtained by removing two or three hydrogens from cycloalkane such as cycloheptane, cyclohexane and cyclooctane, (iii) a group obtained by removing two or three hydrogens from aromatic compound composed only of hydrocarbon such as benzene and naphthalene, and (iv) a group obtained by removing two or three hydrogens from N- and/or O-containing alicyclic hydrocarbon compound and containing an amino group, an imino group and/or a carbonyl group, such as piperidine, pyrrolidine and isocyanurate. (iv) is more preferred because it improves pattern reflow and increases adhesiveness to the substrate.

All or part of the above repeating units form a structure represented by the following formula (ia'):

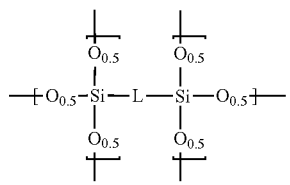

(ia')

wherein
L is —(CR'2)$_n$— or

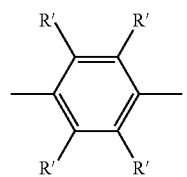

provided that
n is an integer of 1 to 3, and
each R' is independently hydrogen, methyl or ethyl.
In the formula (ia'), L is preferably —(CR'$_2$)$_n$—. The groups R' are the same or different from each other in one repeating unit or in a polysiloxane molecule, but preferably all the groups R' are the same in one molecule and also preferably all of them are hydrogens.

The polysiloxane (Pa) can comprise another repeating unit represented by the following formula (ib):

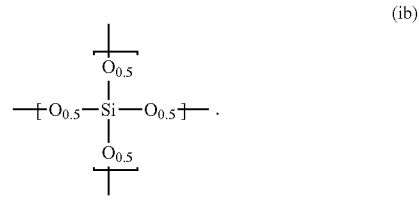

(ib)

The content of the repeating unit (ib) is 40 mol % or less, preferably 10 to 20 mol %, based on the total number of all the repeating units constituting the polysiloxane (Pa).

In view of heat resistance and effects of the above structure (ia') on the taper angle, the total number of the structures (ia') is preferably 0.5 to 50%, more preferably 1 to 30%, based on the total number of all the repeating units in the polysiloxane (Pa).

According to the synthesis process, the polysiloxane (Pa) naturally or inevitably comprises the structure (ia'), in which the repeating units (ia) are directly combined with each other. Further, the polysiloxane (Pa) comprises a block in which the structures (ia') are directly combined with each other. Specifically, for example, the polysiloxane (Pa) comprises blocks represented by the following formulas (ia'-1) to (ia'-3-2):

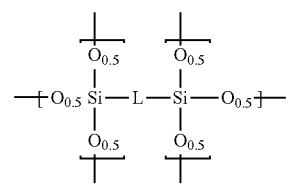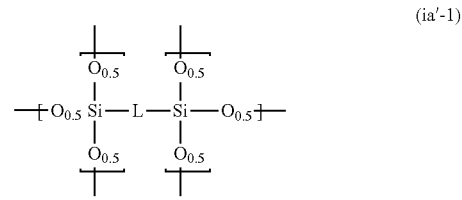

(ia'-1)

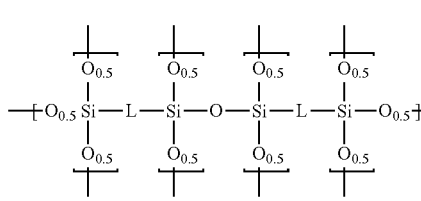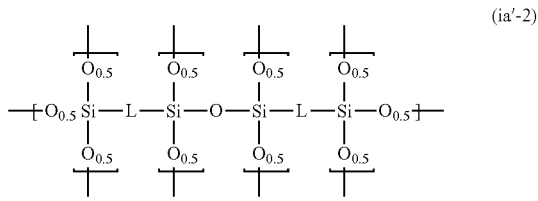

(ia'-2)

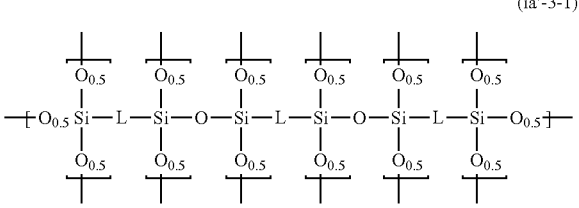

(ia'-3-1)

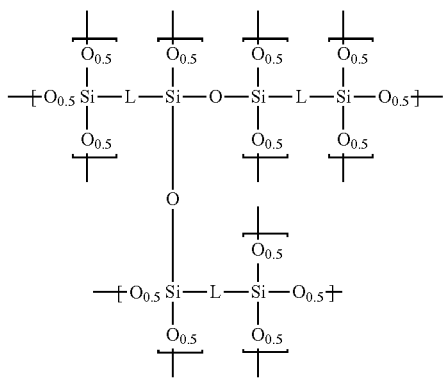
(ia'-3-2)

In the above formulas, each L represents the same as described above. Two or more groups L in each formula or in one polysiloxane molecule are the same or different from each other.

The block (ia'-1) consists of the structure (ia') alone. However, for descriptive purposes, although thus not composed of plural repeating units, the structure (ia'-1) is here shown as a block.

The block (ia'-2) and the blocks (ia'-3-1), (ia'-3-2) are composed of directly combined two and three of the structures (ia'), respectively.

In each block formula shown above, terminal bonds are connected to repeating units other than (ia'). For example, they are connected to (ia) or (ib).

Although not described here, the block can be composed of directly combined four or more of the structures (ia'). The blocks (ia'-2), (ia'-3-1) and (ia'-3-2) are naturally formed when the polysiloxane is synthesized from a raw material having the structure of the repeating unit (ia'). Further, they are inevitably formed when the raw material has the structure of the block (ia'-1), (ia'-2) or the like.

The structures (ia) included in the blocks such as (ia'-2), (ia'-3-1) and (ia'-3-2), each of which comprises directly combined two or more of the structures (ia'), are contained in the polysiloxane (Pa) in a content by number of 10 mol % or more, further preferably 25 mol % or more, based on the total number of all the structures represented by the above formula (ia'), in order that the polysiloxane (Pa) can have stronger crosslinkability.

The polysiloxane (Pa) can further comprise repeating units other than (ia) or (ib), such as, ones derived from vinyl compounds, acrylic compounds, polyester compounds and the like. However, to reduce the organic content in the resultant cured film, the contents thereof are preferably small and further the polysiloxane (Pa) preferably does not contain them at all In the present invention, L in the formula (ia') is limited in length. When L is long, in other words, when the two Si atoms are connected via a long carbon chain, the effect of the present invention tends to be impaired. Further, the summed number of both (ia) serving as a part of (ia') in the polymer and (ia) not connecting to another (ia) via the above R, namely, (ia) having a monovalent R is preferably 60 mol % or more, further preferably 70 mol % or more, based on the total number of all the repeating units (ia) contained in the polysiloxane (Pa).

When the polysiloxane (Pa) comprises the repeating unit (ia) in which R is a bulky group such as phenyl, the effect of the present invention appears strongly. When R is a bulky group, the curing reaction tends to be inhibited by steric hindrance in the pattern formation process. However, since the polysiloxane (Pa) of the present invention comprises the repeating unit (ia'), it is presumed that the bulky groups are positioned at relatively wide intervals and hence the steric hindrance affects the reaction so little that the reaction can proceed rapidly enough to reduce the increase of linewidth in curing of the pattern. The effect of the present invention appears strongly, when the number of (ia) having R of aliphatic or aromatic hydrocarbon groups having 6 or more carbon atoms is preferably 10 mol % or more based on the total number of all the repeating units (ia) contained in the polysiloxane (Pa).

The composition may comprise the repeating unit represented by the following formula (ic). When the polysiloxane (Pa) is alone adopted, the repeating unit represented by the following formula (ic) is contained in a content by number of preferably 25 mol % or less, more preferably 15 mol % or less, based on the total number of the repeating units contained in the polysiloxane (Pa) so that the effect of the present invention can appear strongly.

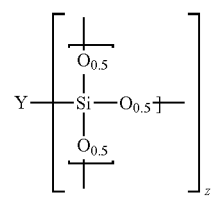
(ic)

wherein

Y is a divalent or trivalent, linear, branched or cyclic, saturated or unsaturated aliphatic hydrocarbon group, or a divalent or trivalent aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon, z is 2 or 3, and Y is neither —$(CR'_2)_n$— nor

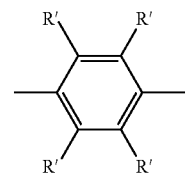

provided that n is an integer of 1 to 3, and each R' is independently hydrogen, methyl or ethyl.

This means that Y is not identical with the above-described L.

Examples of Y include: —$(CR^Y_2)_{y1}$— wherein RY is hydrogen or alkyl and y1 is an integer of 4 or more, and

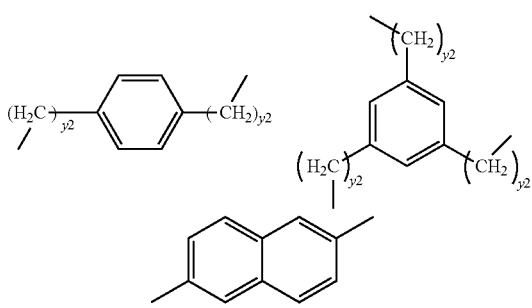

wherein each y2 is independently an integer of 1 or more.

The polysiloxane (Pa) has a structure in which the above-described repeating units or blocks are combined with each other, as described above. There is preferably a silanol group at the terminal. The silanol group means —O$_{0.5}$H connecting to terminal bonds of the above-described repeating units or blocks.

There are no particular restrictions on molecular weight of the polysiloxane (Pa), but the mass average molecular weight thereof is preferably 500 to 25,000, more preferably 1,000 to 20,000. Here, the mass average molecular weight is a mass average molecular weight in terms of polystyrene and can be measured by gel permeation chromatography based on polystyrene.

(2) Polysiloxane (Pb)

The composition according to the present invention can comprise a polysiloxane other than the polysiloxane (Pa). That is preferably a polysiloxane (Pb) which contains the repeating unit represented by the formula (ia) but does not contain the structure represented by the formula (ia'). Specifically, the polysiloxane (Pa) is characterized by containing the structure (ia') while the polysiloxane (Pb) is characterized by not containing the structure (ia'). The structure other than the part represented by the formula (ia) in the polysiloxane (Pa) is not necessarily identical with that of the polysiloxane (Pb). This means that the molecular weights, the contents of the repeating unit (ia), the groups R and the like of the polysiloxanes (Pa) and (Pb) can be individually determined independently of each other.

In addition to the repeating unit (ia), the polysiloxane (Pb) can contain the repeating unit represented by (ib), for example. The polysiloxane (Pb) preferably contains the repeating unit (ib). The content of the repeating unit (ia) is preferably 60 to 100 mol %, more preferably 80 to 90 mol %, and that of the repeating unit (ib) is preferably 40 mol % or less, more preferably 10 to 20 mol %, based on the total number of all the repeating units constituting the polysiloxane (Pb). The polysiloxane (Pb) can further contain the above-described repeating unit (ic). In that case, the number of the repeating unit (ic) is preferably 25% or less, more preferably 15% or less, based on the total number of all the repeating units in the polysiloxane (Pb).

The polysiloxane (Pb) has a structure in which the above-described repeating units or blocks are combined with each other, as described above. There is preferably a silanol group at the terminal. The silanol group means —O$_{0.5}$H connecting to terminal bonds of the above-described repeating units or blocks.

There are no particular restrictions on molecular weight of the polysiloxane (Pb), but the mass average molecular weight thereof is preferably 500 to 25,000, more preferably 1,000 to 20,000.

As described above, the composition according to the present invention comprises the polysiloxane (Pa) or a polysiloxane mixture thereof. The number of the structures represented by (ia') is preferably 0.5 to 50%, more preferably 1 to 30%, based on the total number of all the repeating units contained in the whole of the polysiloxanes so that the effect of the present invention can appear strongly.

The ratio between the polysiloxanes (Pa) and (Pb) is preferably 5:95 to 100:0 by weight. It is properly controlled according to the constituent ratio of (ia') based on the whole of the repeating units (ia) constituting (Pa).

When the polysiloxanes are used in a mixture, the mass average molecular weight of the mixture is generally 500 to 25,000, preferably 1,000 to 20,000, in view of solubility in organic solvents and alkali developing solutions. When the polysiloxane mixture is adopted, as well as when the polysiloxane (Pa) is alone adopted, the content of the repeating unit (ib) is preferably 40 mol % or less, more preferably 10 to 20 mol % and that of the repeating unit (ic) is preferably 25 mol % or less, more preferably 15 mol % or less, based on the total number of all the repeating units constituting the polysiloxanes.

(3) Synthesis Method of Polysiloxanes (Pa) and (Pb)

The polysiloxanes used in the present invention can be obtained through hydrolysis and condensation, optionally in the presence of an acidic catalyst or a basic catalyst, of proper silicon compounds. Examples of usable silicon compounds are as follows.

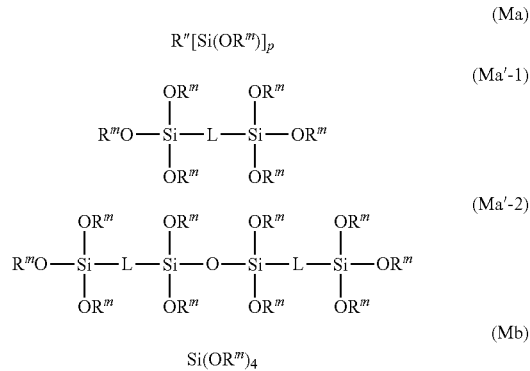

wherein
L is —(CR'$_2$)$_n$— or

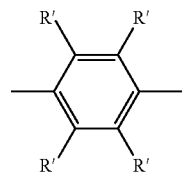

provided that
each n is independently an integer of 1 to 3,
each R' is independently hydrogen, methyl or ethyl,
p is an integer of 1 to 3,
R" is hydrogen, a monovalent to trivalent, linear, branched or cyclic, saturated or unsaturated C$_{1-30}$ aliphatic hydrocarbon group, or a monovalent to trivalent C$_{6-30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, or one or more carbons are unsubstituted or substituted with silicon, and R''' is $C_{1-10}$ alkyl.

Examples of R''' in the above formulas include methyl, ethyl, n-propyl, isopropyl, and n-butyl. Each of the above formulas has plural R''' groups, which may be the same or different from each other.

Specific examples of the silicon compound represented by the formula (Ma) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane, tris-(3-trimethoxysilylpropyl)isocyanurate, tris-(3-triethoxysilylpropyl)isocyanurate, tris-(3-trimethoxysilylethyl)isocyanurate and the like. Among them, methyltrimethoxysilane, methyltriethoxysilane, methyltripropoxysilane and phenyltrimethoxysilane are preferable.

The silicon compounds represented by the formula (Ma'-1) or (Ma'-2) are those represented by the formula (Ma) having specific R". From those compounds, the structure (ia') is inevitably introduced into the polysiloxane structure.

Further, when R" has a functional group, the functional groups in the R" groups may react with each other in course of the synthesis reaction of polysiloxane to form a silicon compound represented by the formula (Ma'-1) or (Ma'-2) or a polysiloxane having the structure (ia')

Specific examples of the silicon compound represented by the formula (Mb) include, for example, tetramethoxysilane, tetraethoxysilane, tetraisopropoxysilane, tetra-n-butoxysilane and tetra.

Here, each silicon compound may be used in combination with two or more kinds.

Further, the composition according to the present invention is for forming a cured film by applying on a substrate, image wise exposing, and developing. For this reason, it is necessary that a difference in solubility is generated between the exposed portion and the unexposed portion. In the case of a positive or negative type composition, the coating film in the exposed or unexposed portion, respectively, should have solubility in the developing solution of a certain level or above. For example, if the rate of dissolution in 2.38% tetramethylammonium hydroxide (hereinafter sometimes referred to as TMAH) aqueous solution of the coating film after prebaking (hereinafter sometimes referred to as ADR, which is described in detail later) is 50 Å/sec or more, forming a pattern by exposure-development is considered possible. However, since solubility required varies depending on the film thickness of the film to be formed and developing conditions, polysiloxane according to the developing conditions should be appropriately selected. Although it varies depending on the type and amount of the photoactive agent contained in the composition, for example, when the film thickness is 0.1 to 100 μm (1,000 to 1,000,000 Å), in the case of a positive type composition, the dissolution rate in 2.38% TMAH aqueous solution is preferably 50 to 5,000 Å/sec, more preferably 200 to 3,000 Å/sec. In the case of a negative type composition, the dissolution rate in 2.38% TMAH aqueous solution is preferably 50 to 20,000 Å/sec, more preferably 1,000 to 10,000 Å/sec.

For the polysiloxane used in the present invention, a polysiloxane having any ADR in the above-mentioned ranges may be selected according to the application and required properties. Further, it is also possible to combine polysiloxanes having different ADRs to get a composition having a desired ADR The polysiloxane having different alkali dissolution rate and mass average molecular weight can be prepared by changing catalyst, reaction temperature, reaction time or polymer. Using polysiloxanes having different alkali dissolution rates in combination, it is possible to improve the reduction of insoluble residue after development, reduction of pattern reflow, pattern stability and the like.

Such a polysiloxane includes, for example, (M) a polysiloxane, the film after pre-baking of which is soluble in 2.38 mass % TMAH aqueous solution and has the dissolution rate of 200 to 3,000 Å/sec.

Further, the composition having a desired dissolution rate can be obtained optionally by mixing with (L) a polysiloxane, the film after pre-baking of which is soluble in 5 mass % TMAH aqueous solution and has the dissolution rate of 1,000 Å/sec or less, or (H) a polysiloxane, the film after prebaking of which has the dissolution rate of 4,000 Å/sec or more in 2.38 mass % TMAH aqueous solution.

[Measurement of Alkaline Dissolution Rate (ADR) and Calculation Method Thereof]

Using TMAH aqueous solution as an alkaline solution, the alkali dissolution rate of polysiloxane or a mixture thereof is measured and calculated as described below.

Polysiloxane is diluted with propylene glycol monomethyl ether acetate (hereinafter referred to as PGMEA) so as to be 35 mass % and dissolved with stirring at room temperature with a stirrer for 1 hour. In a clean room under an atmosphere of temperature of 23.0±0.5° C. and humidity of 50±5.0%, using a pipette, 1cc of the prepared polysiloxane solution is dropped on the center portion of a 4-inch silicon wafer having thickness of 525 μm, spin-coated so as to be a thickness of 2±0.1 μm, and then heated on a hot plate at 100° C. for 90 seconds to remove the solvent. The film thickness of the coating film is measured with a spectroscopic ellipsometer (manufactured by JA Woollam Co., Inc.).

Next, the silicon wafer having this film was gently immersed in a glass petri dish having a diameter of 6 inches, into which 100 ml of TMAH aqueous solution adjusted to 23.0±0.1° C. and having a predetermined concentration was put, then allowed to stand, and the time until the film disappeared was measured. Dissolution rate is obtained by dividing the initial film thickness by the time until 10 mm inside part from the wafer edge of the film disappears. In the case that the dissolution rate is remarkably slow, the wafer is immersed in an aqueous TMAH solution for a certain period and then heated for 5 minutes on a hot plate at 200° C. to remove moisture taken in the film during the dissolution rate measurement, and film thickness is measured. The dissolution rate is calculated by dividing the variation of the film thickness between before and after immersion by the immersing time. The above measurement is carried out 5 times, and the average of the obtained values is taken as the dissolution rate of the polysiloxane.

[(II) Photoactive Agent]

The composition according to the present invention is a photosensitive one, which is categorized into negative or positive type. In the present invention, a positive type photosensitive composition refers to a composition from which a coating film is formed by application and exposed to light, so that the exposed portion undergoes increase of solubility in an alkali developing solution and consequently is removed by development to form a positive image. On the other hand, a negative type photosensitive composition refers to a composition from which a coating film is formed by application and exposed to light, so that the exposed portion becomes insoluble in an alkali developing solution and consequently the unexposed portion is removed by development to form a negative image. In the present invention, a photoactive agent means a compound which thus changes the solubility of the siloxane composition in the exposed or unexposed portion. In some cases, solubility of, in particular, a negative type composition in the exposed or unexposed portion is changed by heating after exposure to light. For descriptive purposes in the present invention, the photoactive agent include a compound having that function.

When the composition according to the present invention is of positive type, a compound which increases solubility in the exposed portion when the coating film is exposed to light is used as the photoactive agent. Such a compound is well known in the field of resist materials, and is often referred to as, for example, dissolution inhibitor. Any dissolution inhibitor can be selected to use in the present invention.

When the composition of the present invention is a positive type one, it preferably contains a diazonaphthoquinone derivative as the photoactive agent. The composition containing a diazonaphthoquinone derivative can form a positive image because the exposed portion thereof becomes soluble in an alkali developing solution and is hence removed by development. That is because, as a result of exposure to light, the exposed portion undergoes increase of solubility in an alkali developing solution by action of generated indene carboxylic acid, while solubility in the unexposed portion decreases by action of interaction with silanol groups remaining in the polysiloxane.

The diazonaphthoquinone derivative is preferably a compound prepared by ester bonding of naphthoquinone diazide sulfonic acid to a compound having a phenolic hydroxy. Although its structure is not particularly limited, it is preferably an ester compound with a compound having one or more phenolic hydroxy. As the naphthoquinone diazide sulfonic acid, 4-naphthoquinonediazidosulfonic acid or 5-naphthoquinonediazidosulfonic acid can be used. Since 4-naphthoquinone diazide sulfonic acid ester compound has absorption in the i-line (wavelength 365 nm) region, it is suitable for i-line exposure. In addition, since 5-naphthoquinone diazide sulfonic acid ester compound has absorption in a wide range of wavelength, it is suitable for exposure in a wide range of wavelength. It is preferable to select an appropriate photosensitizer depending on the wavelength to be exposed. 4-naphthoquinone diazide sulfonic acid ester compound and 5-naphthoquinone diazide sulfonic acid ester compound may be used in combination.

The compound having a phenolic hydroxy is not particularly limited, and examples thereof include bisphenol A, BisP-AF, BisOTBP-A, Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, TrisP-TC (trade name, manufactured by Honshu Chemical Industry Co., Ltd.).

Although the optimum amount varies depending on the esterification ratio of naphthoquinone diazide sulfonic acid, or the physical properties of the polysiloxane to be used, the required photosensitivity and the dissolution contrast between the exposed part and the unexposed part, the addition amount of the diazonaphthoquinone derivative is preferably 1 to 20 parts by mass, more preferably 3 to 15 parts by mass based on 100 parts by mass of the polysiloxane. When the addition amount of the diazonaphthoquinone derivative is 1 part by mass or more, the dissolution contrast between the exposed part and the unexposed part becomes high, and good photosensitivity is obtained. In addition, in order to obtain further better dissolution contrast, it is preferably 3 parts by mass or more. On the other hand, the smaller the addition amount of the diazonaphthoquinone derivative, the better the colorless transparency of the cured film and the higher the transmittance, which is preferable.

When the composition of the present invention is a negative type one, a compound which decreases solubility in the exposed portion when the coating film is exposed to light is used as the photoactive agent. Such a compound is generally referred to as photosensitive agent and is selected depending on the kind of the utilized polysiloxane. For example, it is a compound selected from the group consisting of a photo acid generator, a photo base generator, a photo thermal acid generator and a photo thermal base generator. The negative type photosensitive composition according to the present invention preferably contains any one or more of them.

Although the optimum amount varies depending on the kind of the active substance to be generated by decomposition, the generation amount thereof, required photosensitivity, dissolution contrast between the exposed part and the unexposed part, the addition amount of the photoactive agent in the negative type photosensitive composition is preferably 20 parts by mass or less, for example, 0.1 to 10 parts by mass, more preferably 0.5 to 5 parts by mass based on 100 parts by mass of the total mass of the polysiloxane. When the addition amount is less than 0.1 parts by mass, the amount of acid or base to be generated is too small, polymerization during the post-baking is not accelerated, and pattern reflow tends to occur easily. On the other hand, when the addition amount is more than 20 parts by mass, cracks may be generated in the formed coating film or coloration due to decomposition of the agent may become remarkable, so that colorless transparency of the coating film sometimes decreases. If the addition amount is too large, thermal decomposition causes degradation of electrical insulation of the cured film and release of gas, which may cause problems in the subsequent process. In addition, the resistance of the coating film to a photoresist stripper solution containing, as a main ingredient, monoethanolamine or the like may be decreased.

In the present invention, the photo acid or base generator refers to a compound which undergoes bond cleavage upon exposure to generate an acid or a base, respectively. It is considered that the generated acid or base contributes to the polymerization of the polysiloxane. Here, examples of the light include visible light, ultraviolet light, infrared light, X ray, electron beam, a ray, y ray or the like.

Examples of the photo acid generators, which can be arbitrarily selected from commonly used ones, include diazomethane compounds, triazine compounds, sulfonic acid esters, diphenyliodonium salts, triphenylsulfonium salts, sulfonium salts, ammonium salts, phosphonium salts, sulfonimide compounds, and the like.

Specific examples of the photo acid generators that can be used, including those described above, are 4-methoxyphenyl diphenyl sulfonium hexafluorophosphonate, 4-methoxyphenyl diphenyl sulfonium hexafluoroarsenate, 4-methoxyphenyl diphenyl sulfonium methane sulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsenate, 4-methoxyphenyl diphenyl sulfonium-p-toluene sulfonate, 4-phenyl thiophenyl diphenyl tetrafluoroborate, 4-phenyl thiophenyl diphenyl hexafluorophosphonate, triphenyl sulfonium methanesulfonate, triphenylsulfonium trifluoroacetate, triphenylsulfonium-p-toluenesulfonate, 4-methoxyphenyl diphenylsulfonium tetrafluoroborate, 4-phenylthiophenyl diphenyl hexafluoroarsenate, 4-phenylthiophenyl diphenyl-p-toluenesulfonate, N-(trifluoromethylsulfonyloxy)succinimide, N-(trifluoromethylsulfonyloxy)phthalimide, 5-norbornene-2,3-dicarboximidyl triflate, 5-norbornene-2,3-dicarboximidyl-p-toluenesulfonate, 4-phenylthiophenyldiphenyltrifluoromethanesulfonate, 4-phenylthiophenyl diphenyl trifluoroacetate, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-naphthylimide, N-(nonafluorobutylsulfonyloxy)naphthyl-imide, and the like.

In addition, when absorption of the h-line is not desired, use of 5-propylsulfonyloxyimino-5H-thiophen-2-ylidene-(2-methylphenyl)acetonitrile, 5-octylsulfonyl-oxyimino-5H-thiophene-2-ylidene-(2-methylphenyl)-acetonitrile, 5-camphorsulfonyloxyimino-5H-thiophene-2-ylidene-(2-methylphenyl)acetonitrile, 5-methylphenyl-sulfonyloxy-imino-5H-thiophene-2-ylidene-(2-methyl-phenyl)acetonitrile should be avoided, since they have absorption in the wavelength region of h-line.

Examples of the photo base generator include mufti-substituted amide compounds having an amide group, lactams, imide compounds or ones containing its structure.

In addition, an ionic photo base generator including, as anion, an amide anion, a methide anion, a borate anion, a phosphate anion, a sulfonate anion, a carboxylate anion, or the like can also be used.

In the present invention, the photo thermal acid or base generator refers to a compound which changes the chemical structure but does not generate an acid or a base only by exposure to light but which generates an acid or a base, respectively, by subsequent heating. The photo thermal base generator is preferable between them. Preferred photo thermal base generators include those represented by the following general formula (II), and hydrates or solvates thereof are more preferable. The compound represented by the general formula (II) undergoes inversion to cis-form to be unstable when exposed to light, so that the decomposition temperature decreases and the base is generated even if the baking temperature is about 100° C. in the subsequent process.

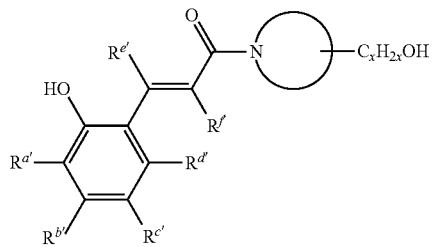

(II)

wherein x is an integer of 1 or more and 6 or less, and $R^{a'}$ to $R^{f'}$ are each independently hydrogen, halogen, hydroxy, mercapto, sulfide, silyl, silanol, nitro, nitroso, sulfino, sulfo, sulfonato, phosphino, phosphinyl, phosphono, phosphonato, amino, ammonium, a $C_{1-20}$ aliphatic hydrocarbon group which may contain a substituent, a $C_{6-22}$ aromatic hydrocarbon group which may contain a substituent, a $C_{1-20}$ alkoxy which may contain a substituent, or a $C_{6-20}$ aryloxy group which may contain a substituent.

Among these, $R^{a'}$ to $R^{d'}$ are particularly preferably hydrogen, hydroxy, $C_{1-6}$ aliphatic hydrocarbon group, or $C_{1-6}$ alkoxy, and $R^{e'}$ and $R^{f'}$ are particularly preferably hydrogen. Two or more of $R^{a'}$ to $R^{d'}$ may be combined to form a cyclic structure. At this time, the cyclic structure may contain a hetero atom.

N is a constituent atom of a nitrogen-containing heterocyclic ring, the nitrogen-containing heterocyclic ring is a 3- to 10-membered ring, and the nitrogen-containing heterocyclic ring may further have a $C_{1-20}$, in particular $C_{1-6}$, aliphatic hydrocarbon group, which may contain one or more substituents that are different from $C_xH_{2x}OH$ shown in the formula (II).

It is preferred that $R^{a'}$ to $R^{d'}$ are appropriately selected according to the exposure wavelength to be used. In display applications, for example, unsaturated hydrocarbon bonding functional groups such as vinyl and alkynyl which shift the absorption wavelength to g-, h- and i-lines, alkoxy, nitro and the like are used, and methoxy and ethoxy are particularly preferred.

Specific examples are as follows.

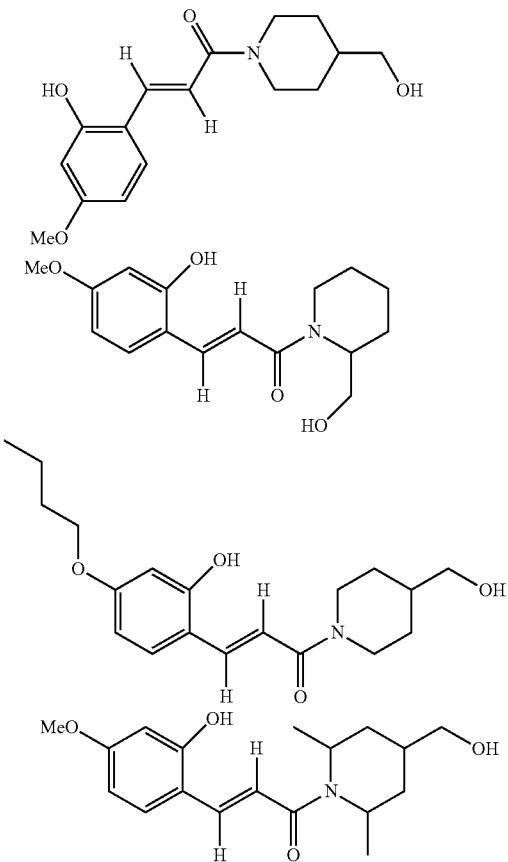

-continued

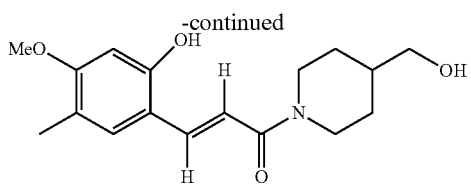

[(III) Solvent]

The composition according to the invention comprises a solvent. This solvent is selected from those which uniformly dissolve or disperse each component contained in the composition. Specific examples of the solvent include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol monoalkyl ethers such as propylene glycol monomethyl ether (PGME) and propylene glycol monoethyl ether;

propylene glycol alkyl ether acetates such as propylene glycol monomethyl ether acetate (PGMEA), propylene glycol monoethyl ether acetate and propylene glycol monopropyl ether acetate; aromatic hydrocarbons such as benzene, toluene and xylene; ketones such as methyl ethyl ketone, acetone, methyl amyl ketone, methyl isobutyl ketone and cyclohexanone; and alcohols such as isopropanol and propane diol. PGMEA and PGME are preferable. These solvents are used alone or in combination of two or more kinds.

The content of the solvent varies depending on the application method and the demand for the film thickness after coating. For example, in the case of spray coating, it is 90 mass % or more based on the total mass of the polysiloxane, but in the case of slit coating of a large glass substrate used for manufacturing displays, it is usually 50 mass % or more, preferably 60 mass % or more, and usually 90 mass % or less, preferably 85 mass % or less.

[(IV) Other Additives]

The composition according to the present invention indispensably contains the above (I) to (III) components but can contain other additives as needed.

Examples of such additives include a thermal acid generator and a thermal base generator.

In the present invention, the thermal acid or base generator refers to a compound which undergoes bond cleavage upon heating to generate an acid or a base, respectively. When the composition of the present invention is a positive type photosensitive one, they can be used to further promote curing of the formed pattern. Accordingly, they preferably generate little or no acid or base when heated in pre-baking after the composition is applied, and preferably they function when heated in the curing process after the pattern is formed.

Examples of the thermal acid generators include salts and esters that generate organic acids, such as various aliphatic sulfonic acids and salts thereof, various aliphatic carboxylic acids such as citric acid, acetic acid and maleic acid and salts thereof, various aromatic carboxylic acids such as benzoic acid and phthalic acid and salts thereof, aromatic sulfonic acids and ammonium salts thereof, various amine salts, aromatic diazonium salts, and phosphonic acids and salts thereof. Among the thermal acid generators, in particular, it is preferably a salt composed of an organic acid and an organic base, further preferably a salt composed of sulfonic acid and an organic base. Preferred sulfonic acids include p-toluenesulfonic acid, benzenesulfonic acid, p-dodecylbenzenesulfonic acid, 1,4-naphthalenedisulfonic acid, methanesulfonic acid, and the like. These acid generators can be used alone or in combination. Examples of the thermal base generators include compounds that generate bases such as imidazole, tertiary amine and quaternary ammonium, and mixtures thereof. Examples of the bases to be released include imidazole derivatives such as N-(2-nitrobenzyloxycarbonyl) imidazole, N-(3-nitrobenzyloxycarbonyl) imidazole, N-(4-nitrobenzyloxycarbonyl) imidazole, N-(5-methyl-2-nitrobenzyloxycarbonyl) imidazole and N-(4-chloro-2-nitrobenzyloxycarbonyl) imidazole, and 1,8-diazabicyclo[5.4.0]undecene-7. Like the acid generators, these base generators can be used alone or in combination.

The positive type photosensitive composition can be incorporated with a photo acid generator, a photo base generator, a photo thermal acid generator or a photo thermal base generator. They are described above for the negative type photosensitive composition. In this case, curing of the formed pattern can be further promoted with those compounds by subjecting the pattern to entire surface exposure. This means that those compounds used in the positive type composition function not as photoactive agents for forming the pattern but as curing promoter. However, in exposure to light for forming a pattern, such a curing promoter contained in the coating film may absorb light and generate an acid to inhibit light-absorption of a diazonaphthoquinone derivative serving as the photoactive agent. Accordingly, when incorporated in the positive type composition, the curing promoter is preferably selected in consideration of absorption and exposure wavelengths of the photoactive agent (diazonaphthoquinone derivative). In other words, the effect of diazonaphthoquinone derivative can appear favorably if the curing promoter is so selected that the absorption thereof is low in the wavelength range where the photoactive agent has strong absorption.

Specifically, when the first exposure is performed with g-line (peak wavelength 436 nm) and/or h-line (peak wavelength 405 nm) and the wavelength of the entire surface exposure is set g+h+i-lines (peak wavelength 365 nm), it is preferable that the curing promoter has the absorbance at wavelength of 365 nm which is larger than the absorbance at wavelength of 436 nm and/or 405 nm. More specifically, the ratio of (the absorbance at wavelength of 365 nm)/(the absorbance at wavelength of 436 nm), or the ratio of (the absorbance at wavelength of 365 nm)/(the absorbance at wavelength of 405 nm) is preferably 2 or more, more preferably 5 or more, further preferably 10 or more, and the most preferably 100 or more. When the polysiloxane (Pa) comprises a small number of the repeating units (ia), it can be controlled by adding those compounds.

Here, the ultraviolet-visible absorption spectrum is measured using dichloromethane as a solvent. The measuring equipment is not particularly limited, but for example, Cary 4000 UV-Vis spectrophotometer (Agilent Technologies, Inc.) can be used.

Other optional additives are, for example, surfactants, developing solution solubility enhancers, scum removers, adhesion enhancers, polymerization inhibitors, antifoaming agents, and sensitizers. Those additives can be used in either the positive or negative type photosensitive composition.

Since the surfactant can improve coatability, to use it is preferable. Examples of the surfactant that can be used in the siloxane composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer;

acetylene alcohol; acetylene glycol; polyethoxylate of acetylene alcohol; acetylene alcohol derivatives, such as polyethoxylate of acetylene alcohol; acetylene glycol derivatives, such as polyethoxylate of acetylene glycol; fluorine-containing surfactants, such as Fluorad (trade name, manufactured by Sumitomo 3M Limited), Megafac (trade name, manufactured by DIC Corporation), Surufuron (trade name, Asahi Glass Co., Ltd.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol and the like.

Further, examples of the anionic surfactant include ammonium salt or organic amine salt of alkyl diphenylether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the content thereof is usually 50 to 10,000 ppm, preferably 100 to 5,000 ppm, based on the total mass of the composition.

The developing solution solubility enhancers or the scum removers have functions of controlling solubility of the formed coating film in a developing solution or of preventing scum from remaining on the substrate after development, respectively. As those additives, crown ethers are usable.

The addition amount thereof is preferably 0.05 to 15 parts by mass, more preferably 0.1 to 10 parts by mass based on 100 parts by mass of the total mass of the polysiloxane.

Further, sensitizers can be added as needed. Examples of the sensitizers preferably used in the positive type photosensitive composition include sensitizing dyes, such as, coumarin, ketocoumarin and derivatives thereof; thiopyrylium salts, acetophenones, pyrylium salts and thiopyrylium salts.

In addition, anthracene skeleton-containing compounds can be used as the sensitizers. When the sensitizers are used, the addition amount thereof is preferably 0.01 to 5 parts by mass based on 100 parts by mass of the total mass of the polysiloxane.

As the polymerization inhibitors, UV absorbers as well as nitroso, nitroxide radical, hydroquinone, catechol, phenothiazine, phenoxazine, hindered amine and derivatives thereof can be added. They can be used alone or in combination, and the addition amount thereof is preferably 0.01 to 20 parts by mass based on 100 parts by mass of the total mass of the polysiloxane.

Examples of the antifoaming agents include alcohols ($C_1$ to $_{18}$), higher fatty acids such as oleic acid and stearic acid, higher fatty acid esters such as glyceryl monolaurate, polyethers such as polyethylene glycol (PEG) (Mn: 200 to 10,000) and polypropylene glycol (PPG) (Mn: 200 to 10,000), silicone compounds such as dimethyl silicone oil, alkyl modified silicone oil and fluorosilicone oil, and organic siloxane surfactants. Those can be used alone or in combination, and the addition amount thereof is preferably 0.1 to 3 parts by mass based on 100 parts by mass of the total mass of the polysiloxane.

When the film is formed from the composition of the present invention and then cured, the adhesion enhancers have functions of preventing the cured film from exfoliation caused by stress generated after curing. As the adhesion enhancers, imidazoles and coupling agents are preferable.

Those optional additives can be used alone or in combination, and the addition amount thereof is 20 parts or less by mass, preferably 0.05 to 15 parts by mass based on 100 parts by mass of the total mass of the polysiloxane.

<Pattern Forming Method>

In the pattern forming method according to the present invention, the above-described composition is applied on a substrate, image wise exposed to light, and developed to form a pattern. When the content of the repeating unit (ia') is changed in the polysiloxane (Pa) or mixture thereof of the present invention, the pattern changes in the taper angle and the line width. Accordingly, the relation between the taper angle or the line width of the formed pattern and the content of the repeating unit (ia') in the polysiloxane (Pa) is obtained and then, on the basis of the obtained relation, the content of the repeating unit (ia') in the polysiloxane is so determined that the formed pattern may have a desired shape. In general, when the developed pattern is heated to cure, the pattern often changes in shape. Specifically, the developed pattern generally has a rectangular section and the side wall thereof stands almost straight upright. However, when the pattern is heated, the coating film is temporarily softened and the sectional shape of the pattern tends to change from a rectangle to a trapezoid. As a result, the inclined angle of the side wall, namely, the taper angle tends to be decreased and the sectional bottom width of the pattern, namely, the line width tends to be increased by heating.

In contrast, by using the composition according to the present invention, the increase of the line width can be inhibited when the developed pattern is heated to cure even though the taper angle is decreased. This is presumed to be because, although the coating film is softened and the taper angle is decreased particularly in the bottom area of the pattern by heating, the curing reaction tends to proceed so rapidly that the taper angle is less decreased in the surface area of the pattern and consequently that the increase in the bottom linewidth of the pattern can be controlled. Specifically, if a 1:3 line-and-space pattern (line: 5 μm, space: 15 μm) shape is formed by exposure from the composition of the present invention, the increasing ratio of the linewidth after heating for curing to that after developing can be suppressed to 35% or less. Further, the composition according to the present invention also makes it possible to control the taper angle. This means that, according to the present invention, the line width of the exposed film can be kept from increasing in development and also the taper angle can be desirably changed. The desired taper angle depends on application of the formed pattern. If the composition of the present invention is adopted to form a pattern, the taper angle of the heated and cured pattern can be controlled to be less than 90°, preferably in the range of 15 to 80°.

First, the above-described composition is applied on a substrate. Formation of the coating film of the composition in the present invention can be carried out by a generally known method, such as, dip coating, roll coating, bar coating, brush coating, spray coating, doctor coating, flow coating, spin coating, slit coating and the like.

As the substrate, a suitable substrate such as a silicon substrate, a glass substrate, a resin film, or the like can be used. The substrate may be provided with various semiconductor devices or the like as needed. When the substrate is a film, gravure coating can also be used. If desired, a drying process may be additionally set after coating the film. The coating process can be repeated once or twice or more to make the film thickness of the formed coating film as desired.

After forming the coating film of the composition according to the present invention, it is preferable to carry out pre-baking (heat treatment) of the coating film in order to dry the coating film and reduce the residual amount of the solvent. The pre-baking process can be generally carried out at a temperature of 70 to 150° C., preferably 90 to 120° C., in the case of a hot plate, for 10 to 180 seconds, preferably 30 to 90 seconds and in the case of a clean oven, for 1 to 30 minutes.

After the coating film is formed, the surface of the coating film is image wise irradiated with light. As a light source to be used for the light irradiation, any arbitrary one conventionally used for a pattern forming method can be used. As such a light source, a high-pressure mercury lamp, a low-pressure mercury lamp, a lamp such as metal halide and xenon, a laser diode, an LED and the like can be included. Ultraviolet rays such as g-line, h-line and i-line are usually used as the irradiation light. Except ultrafine processing for semiconductors or the like, it is general to use light of 360 to 430 nm (high-pressure mercury lamp) for patterning of several μm to several ten μm. Above all, in the case of liquid crystal display devices, light of 430 nm is often used. The energy of the irradiation light is generally 5 to 2,000 mJ/cm$^2$, preferably 10 to 1,000 mJ/cm$^2$, although it depends on the light source and the film thickness of the coating film. If the irradiation light energy is lower than 10 mJ/cm$^2$, sufficient resolution may not be obtained in some cases. On the other hand, when the irradiation light energy is higher than 2,000 mJ/cm$^2$, the exposure becomes excess and halation may be generated.

In order to irradiate light in a pattern shape, a general photomask can be used. Such a photomask can be arbitrarily selected from well-known ones. The environment at the time of irradiation is not particularly limited, and generally it may be set as an ambient atmosphere (in the air) or nitrogen atmosphere. In the case of forming a film on the entire surface of the substrate, light irradiation may be performed to the entire surface of the substrate. In the present invention, the pattern film also includes such a case where a film is formed on the entire surface of the substrate.

Particularly in the case of a negative type composition, post-exposure baking can be carried out as needed after the exposing process so that interpolymer reactions in the coating film can be promoted by acid or base generated in the exposed portion. This heating treatment differs from the below-described heating process in that it is not for the purpose of curing the coating film completely but for the purpose of making it possible to leave a desired pattern on the substrate after development and to remove the part other than the pattern by development.

When the post-exposure baking is carried out, it is possible to use a hot-plate, an oven, a furnace or the like. The heating temperature should not be too high because it is unfavorable for the acid or base generated by exposure in the exposed portion to diffuse into the unexposed portion. In view of that, the temperature of post-exposure baking is preferably 40 to 150° C., more preferably 60 to 120° C. If necessary, the temperature may be step-by-step increased so as to control the curing speed of the composition. There are no particular restrictions on the atmosphere of baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere or the like. The baking time is preferably longer than a certain period so as to keep higher uniformity of thermal budget in the wafer surface, but also preferably not excessively long so as to prevent the diffusion of acid. In consideration of those, the baking time is preferably 20 to 500 seconds, more preferably 30 to 300 seconds.

When the positive type composition is used, the post exposure baking process had better not be performed, so as not to promote crosslinking between polymers.

After the exposure to light, the coating film is developed. As the developing solution to be used at the time of development, any developing solution conventionally used for developing the photosensitive composition can be used. Preferable examples of the developing solution include an alkali developing solution which is an aqueous solution of an alkaline compound such as tetraalkylammonium hydroxide, choline, alkali metal hydroxide, alkali metal metasilicate (hydrate), alkali metal phosphate (hydrate), aqueous ammonia, alkylamine, alkanolamine and heterocyclic amine, and a particularly preferable alkali developing solution is a tetramethylammonium hydroxide aqueous solution. In the alkali developing solution, a water-soluble organic solvent such as methanol, ethanol, or a surfactant may be further contained, if necessary. The developing method can also be arbitrarily selected from conventionally known methods. Specifically, methods such as dipping in a developing solution (dip), paddle, shower, slit, cap coat, spray and the like can be included. After development with the developer, by which a pattern can be obtained, it is preferable that washing with water is carried out.

Thereafter, an entire surface exposure (flood exposure) process is usually performed. When a photo acid generator or a photo base generator is used, an acid or a base is generated in this entire surface exposure process. Further, when a photo thermal acid generator or a photo thermal base generator is used, the chemical structure thereof is changed in this entire surface exposure process. Furthermore, since the unreacted diazonaphthoquinone derivative remaining in the film is decomposed by light to further improve the optical transparency of the film, it is preferable to perform the entire surface exposure process when transparency is required. Even when a thermal acid generator or a thermal base generator is added in the positive type composition, it is preferable to perform the entire surface exposure for the above purpose. As the method of entire surface exposure, there is a method for exposing light over the entire surface with about 100 to 2,000 mJ/cm$^2$ (in terms of exposure amount at wavelength of 365 nm) using an ultraviolet visible exposure machine such as an aligner (for example, PLA-501F manufactured by Canon Inc.).

After development, the coating film is cured by heating the obtained patterned film. The heating temperature in this heating process is not particularly limited as long as it is a temperature at which the coating film can be cured and can be arbitrarily determined. However, if a silanol group remains, chemical resistance of the cured film may become insufficient or the dielectric constant of the cured film may become high. From this viewpoint, for the heating temperature, relatively high temperature is generally selected. In order to promote the curing reaction to obtain a sufficient cured film, the curing temperature is preferably 200° C. or more, more preferably 300° C. or more. Further, the heating time is not particularly limited, and is generally determined to be 10 minutes to 24 hours, preferably 30 minutes to 3 hours. This heating time is the time after the temperature of the patterned film reaches a desired heating temperature. Normally, it takes from several minutes to several hours until the patterned film reaches a desired temperature from the temperature before heating.

Further, the cured film according to the present invention has high transmittance. Specifically, the transmittance for the light having wavelength of 400 nm is preferably 90% or more.

The cured film thus formed can be suitably utilized in many fields. For example, it can be used not only as an interlayer insulating film, a transparent protective film and the like for various devices but also as an interlayer insulating film for low temperature polysilicon or a buffer coat film for IC chip and the like.

The formed cured film is thereafter subjected to further post-processing of the substrate such as processing or circuit formation, if necessary, and an electronic device is formed. Any of conventionally known methods can be applied to the post-processing.

The present invention is explained more specifically below by use of Examples and Comparative Examples, but the present invention is not limited by these Examples and Comparative Examples at all.

Synthesis Example 1 (Synthesis of Polysiloxane Pb-1)

Into a 2 L three-necked flask equipped with a stirrer, a thermometer and a cooling pipe, 49.0 g of 25 mass % tetramethylammonium hydroxide (TMAH) aqueous solution, 600 ml of isopropyl alcohol (IPA) and 4.0 g of water were charged, and then in a dropping funnel, a mixed solution of 68.0 g of methyltrimethoxy-silane, 79.2 g of phenyltrimethoxysilane and 15.2 g of tetramethoxysilane was prepared. The mixed solution was dropped into the flask at 40° C., stirred at the same temperature for 2 hours, and then neutralized by adding 10% HCl aqueous solution. To the neutralized solution, 400 g of toluene and 600 ml of water were added so that the solution was separated into two phases. After the aqueous phase was removed, the organic phase was washed three times with 300 ml of water and then concentrated under reduced pressure to remove the solvent. To the concentrate, PGMEA was added so as to adjust the solid content to 35 mass %.

The molecular weight (in terms of polystyrene reduced value) of the obtained polysiloxane was measured by gel permeation chromatography to find the mass average molecular weight (hereinafter sometimes abbreviated as "Mw") was 1800. In addition, the obtained resin solution was coated on a silicon wafer by a spin coater (MS-A100, manufactured by Mikasa Co., Ltd.) so as to make the film thickness after pre-baking to be 2 μm, and then the dissolution rate in 2.38% TMAH aqueous solution (hereinafter sometimes abbreviated as "ADR") was measured after pre-baking to find 1200 Å/sec.

Synthesis Example 2 (Synthesis of Polysiloxane Pb-2)

Into a 2 L three-necked flask equipped with a stirrer, a thermometer and a cooling pipe, 24.5 g of 25 mass % TMAH aqueous solution, 600 ml of IPA and 4.0 g of water were charged, and then in a dropping funnel, a mixed solution of 81.7 g of methyltrimethoxysilane and 79.2 g of phenyltrimethoxysilane was prepared. The mixed solution was dropped into the flask at 40° C., stirred at the same temperature for 2 hours, and then neutralized by adding 10% HCl aqueous solution. To the neutralized solution, 400 g of toluene and 600 ml of water were added so that the solution was separated into two phases. After the aqueous phase was removed, the organic phase was washed three times with 300 ml of water and then concentrated under reduced pressure to remove the solvent. To the concentrate, PGMEA was added so as to adjust the solid content to 35 mass %.

The obtained polysiloxane was found to have Mw=1,400 and ADR=1,100 Å/sec.

Synthesis Example 3 (Synthesis of Polysiloxane Pa-1)

Into a 2 L three-necked flask equipped with a stirrer, a thermometer and a cooling pipe, 102 g of 25 mass % tetramethylammonium hydroxide (TMAH) aqueous solution, 600 ml of isopropyl alcohol (IPA) and 4.0 g of water were charged, and then in a dropping funnel, a mixed solution of 68.0 g of methyltrimethoxy-silane, 79.2 g of phenyltrimethoxysilane and 49.5 g of 1,3-bis(2-trimethoxysilylethyl)tetramethoxydisiloxane was prepared. The mixed solution was dropped into the flask at 40° C., stirred at the same temperature for 2 hours, and then neutralized by adding 10% HCl aqueous solution. To the neutralized solution, 400 g of toluene and 600 ml of water were added so that the solution was separated into two phases. After the aqueous phase was removed, the organic phase was washed three times with 400 ml of water and then concentrated under reduced pressure to remove the solvent. To the concentrate, PGMEA was added so as to adjust the solid content to 35 mass %.

The obtained polysiloxane was found to have Mw=12,000 and ADR=600 Å/sec.

Synthesis Example 4 (Synthesis of Polysiloxane Pa-2)

Into a 2 L three-necked flask equipped with a stirrer, a thermometer and a cooling pipe, 102 g of 25 mass % tetramethylammonium hydroxide (TMAH) aqueous solution, 600 ml of isopropyl alcohol (IPA) and 4.0 g of water were charged, and then in a dropping funnel, a mixed solution of 68.0 g of methyltrimethoxy-silane, 79.2 g of phenyltrimethoxysilane and 54.0 g of bis(trimethoxysilyl)ethane was prepared. The mixed solution was dropped into the flask at 40° C., stirred at the same temperature for 2 hours, and then neutralized by adding 10% HCl aqueous solution. To the neutralized solution, 400 g of toluene and 600 ml of water were added so that the solution was separated into two phases. After the aqueous phase was removed, the organic phase was washed three times with 400 ml of water and then concentrated under reduced pressure to remove the solvent. To the concentrate, PGMEA was added so as to adjust the solid content to 35 mass %. The obtained polysiloxane was found to have Mw=12,500 and ADR=600 Å/sec.

Synthesis Example 5 (Synthesis of Polysiloxane Pa-3)

Into a 2 L three-necked flask equipped with a stirrer, a thermometer and a cooling pipe, 91 g of 25 mass % tetramethylammonium hydroxide (TMAH) aqueous solution, 600 ml of isopropyl alcohol (IPA) and 4.0 g of water were charged, and then in a dropping funnel, a mixed solution of 68.0 g of methyltrimethoxy-silane, 79.2 g of phenyltrimethoxysilane and 68.1 g of bis(triethoxysilyl) methane was prepared. The mixed solution was dropped into the flask at 40° C., stirred at the same temperature for 2 hours, and then neutralized by adding 10% HCl aqueous solution. To the neutralized solution, 400 g of toluene and 600 ml of water were added so that the solution was separated into two phases. After the aqueous phase was removed, the organic phase was washed three times with 400 ml of water and then concentrated under reduced pressure to remove the solvent. To the concentrate, PGMEA was added so as to adjust the solid content to 35 mass %.

The obtained polysiloxane was found to have Mw=7,500 and ADR=500 Å/sec.

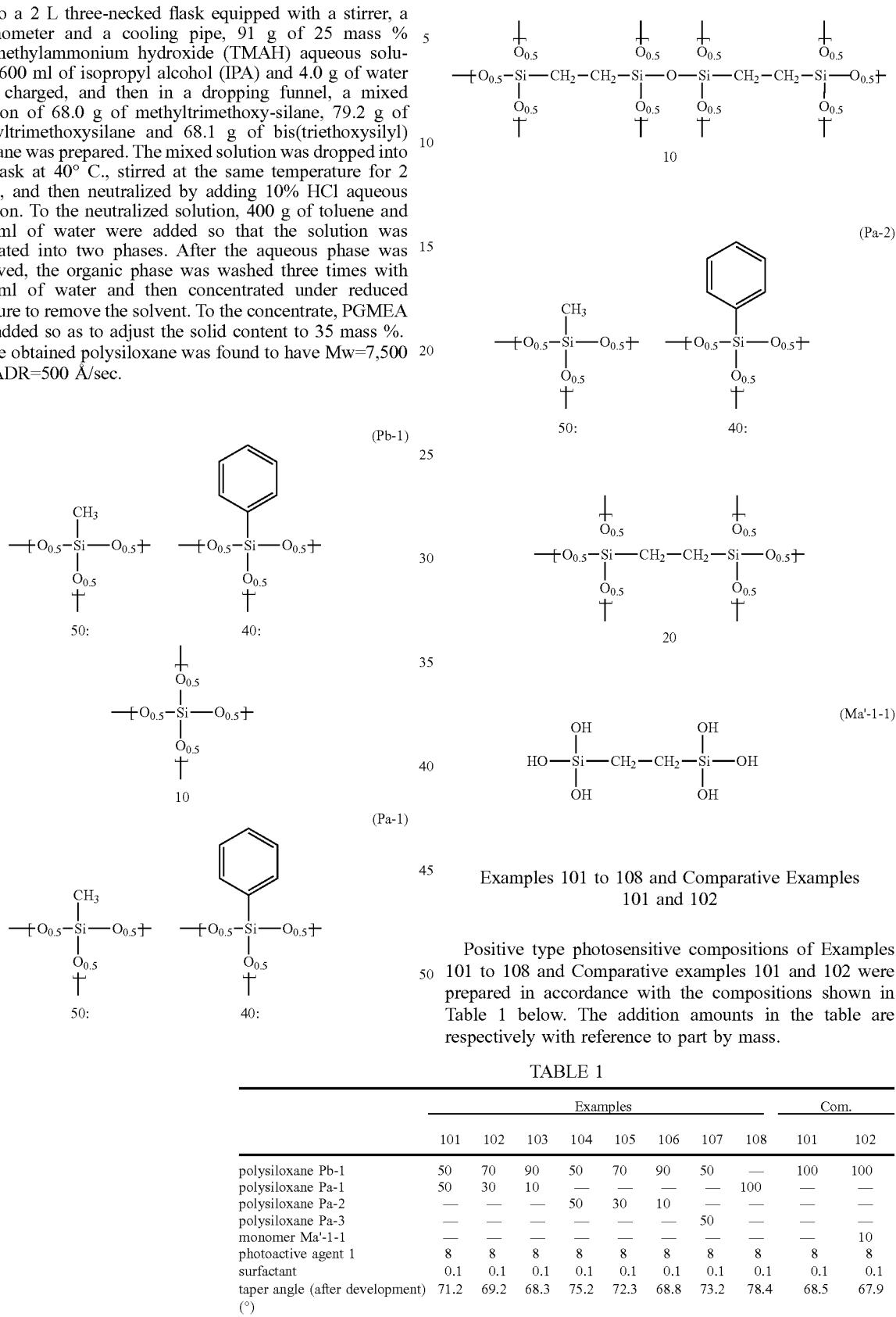

Examples 101 to 108 and Comparative Examples 101 and 102

Positive type photosensitive compositions of Examples 101 to 108 and Comparative examples 101 and 102 were prepared in accordance with the compositions shown in Table 1 below. The addition amounts in the table are respectively with reference to part by mass.

TABLE 1

|  | Examples | | | | | | | | Com. | |
|---|---|---|---|---|---|---|---|---|---|---|
|  | 101 | 102 | 103 | 104 | 105 | 106 | 107 | 108 | 101 | 102 |
| polysiloxane Pb-1 | 50 | 70 | 90 | 50 | 70 | 90 | 50 | — | 100 | 100 |
| polysiloxane Pa-1 | 50 | 30 | 10 | — | — | — | — | 100 | — | — |
| polysiloxane Pa-2 | — | — | — | 50 | 30 | 10 | — | — | — | — |
| polysiloxane Pa-3 | — | — | — | — | — | — | 50 | — | — | — |
| monomer Ma'-1-1 | — | — | — | — | — | — | — | — | — | 10 |
| photoactive agent 1 | 8 | 8 | 8 | 8 | 8 | 8 | 8 | 8 | 8 | 8 |
| surfactant | 0.1 | 0.1 | 0.1 | 0.1 | 0.1 | 0.1 | 0.1 | 0.1 | 0.1 | 0.1 |
| taper angle (after development) (°) | 71.2 | 69.2 | 68.3 | 75.2 | 72.3 | 68.8 | 73.2 | 78.4 | 68.5 | 67.9 |

TABLE 1-continued

| | Examples | | | | | | | | Com. | |
|---|---|---|---|---|---|---|---|---|---|---|
| | 101 | 102 | 103 | 104 | 105 | 106 | 107 | 108 | 101 | 102 |
| taper angle (after curing) (°) | 64.4 | 43.0 | 17.4 | 73.6 | 48.9 | 17.3 | 63.1 | 78.0 | (7) | (9) |
| linewidth increasing ratio | 6 | 23 | 25 | 1 | 20 | 19 | 0 | 1 | (75) | (72) |
| hardness (N/mm$^2$) | 433 | | | 432 | | | 449 | | 295 | |

In the table,
Photoactive agent 1: 4,4'-(1-(4-(1-(4-hydroxy-phenyl)-1-methylethyl)phenyl)ethylidene)bisphenol modified with 2.0 mole of diazonaphthoquinone;
Surfactant: KF-53, manufactured by Shin-Esu Chemical Co., Ltd.
Each "—" means that the compound was not added, and the blanks mean that the measurements were not carried out. The numbers in parentheses mean taper angles or linewidth increasing ratios extrapolated from the sectional shapes because the angles of the cured pattern side-walls were decreased to be very small.

[Taper Angle and Linewidth Increasing Ratio]

Each composition was applied on a 4-inch silicon wafer by spin coating so that the resultant film might be 2 μm-thick. The obtained film was pre-baked at 100° C. for 90 seconds to evaporate the solvent. The dried coating film was exposed to light in a line-and-space pattern shape (5 μm line, 15 μm space) with 100 to 200 mJ/cm$^2$ by means of g+h+i lines mask aligner (PLA-501F type, product name, manufactured by Canon Inc.), and thereafter subjected to puddle development for 120 seconds using 2.38% TMAH aqueous solution and further rinsed with pure water for 60 seconds. After drying, the taper angle of the developed pattern was measured with a scanning electron microscope (SEM). Further, the developed pattern was subjected to flood exposure with 1,000 mJ/cm$^2$ by means of a g+h+i lines mask aligner, and then heated to cure in air at 250° C. for 30 minutes. The cured pattern was observed with a scanning electron microscope (SEM) to measure the taper angle thereof. Meanwhile, the line width of the pattern was observed with a SEM after the development and also after the curing, to measure the linewidth increasing ratio.

[Hardness of Pattern]

The hardness of the cured pattern was measured by means of a nanoindenter (ENT-2100, product name, manufactured by ELIONIX INC.) with a test load of 0.2 mN.

The results revealed that, according to the present invention, the taper angle can be controlled by using a positive type photosensitive siloxane composition according to the present invention which comprises a particular polysiloxane having a controlled content of the repeating unit (ia').

Example 201 and Comparative Example 201

Negative type photosensitive compositions of Example 201 and Comparative example 201 were prepared in accordance with the compositions shown in Table 2 below. The addition amounts in the table are respectively with reference to part by mass.

TABLE 2

| | Ex. 201 | Com. 201 |
|---|---|---|
| polysiloxane Pb-2 | 50 | 100 |
| polysiloxane Pa-1 | — | — |
| polysiloxane Pa-2 | 50 | — |
| polysiloxane Pa-3 | — | — |
| monomer Ma'-1-1 | — | — |
| photoactive agent 2 | 1 | 1 |
| surfactant | 0.1 | 0.1 |
| taper angle (after development) (°) | 77.5 | 64.2 |

TABLE 2-continued

| | Ex. 201 | Com. 201 |
|---|---|---|
| taper angle (after curing) (°) | 53.0 | (22.5) |
| linewidth increasing ratio | 8 | 38 |

In the table, Photoactive agent 2 (photo acid generator): 1,8-naphthalimidyl triflate, trade name "NAI-105", manufactured by Midori Kagaku Co., Ltd.;
Surfactant: KF-53, manufactured by Shin-Etsu Chemical Co., Ltd.
Each "—" means that the compound was not added. The number in parentheses means a taper angle extrapolated from the sectional shape because the angle of the cured pattern side-wall was decreased to be very small.

[Taper Angle]

Each composition was applied on a 4-inch silicon wafer by spin coating so that the resultant film might be 2 μm-thick. The obtained film was pre-baked at 100° C. for 90 seconds to evaporate the solvent. The dried coating film was exposed to light in a line-and-space pattern shape (5 μm line, 15 μm space) with 100 to 200 mJ/cm$^2$ by means of g+h+i lines mask aligner (PLA-501F type, product name, manufactured by Canon Inc.). The exposed film was then heated at 100° C. for 90 seconds, and thereafter subjected to puddle development for 90 seconds using 2.38% TMAH aqueous solution and further rinsed with pure water for 60 seconds. After drying, the patterned film was subjected to flood exposure with 1,000 mJ/cm$^2$ by means of a g+h+i lines mask aligner, and then heated to cure in air at 250° C. for 30 minutes. The obtained pattern was observed with a scanning electron microscope (SEM) to measure the taper angle thereof. The results revealed that, according to the present invention, the taper angle can be controlled by using a negative type photosensitive siloxane composition according to the present invention which comprises a particular polysiloxane having a controlled content of the repeating unit (ia').

[Transmittance]

When transmittance of the obtained cured film at 400 nm was measured by means of MultiSpec-1500 manufactured by Shimadzu Corporation, all of them were 90% or more.

The invention claimed is:

1. A photosensitive siloxane composition comprising:
a polysiloxane (Pa)
which contains a repeating unit represented by the following formula (ia):

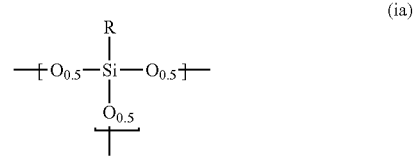

wherein
R is hydrogen, a monovalent to trivalent, linear, branched or cyclic, saturated or unsaturated $C_{1-30}$ aliphatic hydrocarbon group, or a monovalent to trivalent $C_{6-30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, or one or more carbons are unsubstituted or substituted with silicon, when R is divalent or trivalent, R connects Si atoms contained in a plurality of repeating units, and all or part of said repeating units form a structure represented by the following formula (ia'):

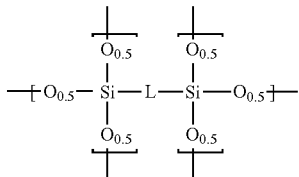

wherein
L is —$(CR'_2)_n$— or

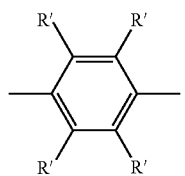

provided that
n is an integer of 1 to 3, and
each R' is independently hydrogen, methyl or ethyl;
a photoactive agent; and
a solvent.

2. The composition according to claim 1, wherein said polysiloxane (Pa) further contains a repeating unit represented by the following formula (ib):

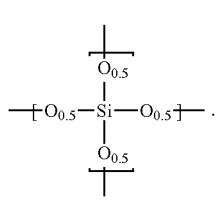

3. The composition according to claim 1, wherein said polysiloxane (Pa) comprises a block in which two or more of said structures represented by the formula (ia') are directly combined with each other.

4. The composition according to claim 3, wherein the number of said structures represented by the formula (ia') included in said blocks is 10 mol % or more based on the total number of all those contained in said polysiloxane (Pa).

5. The composition according to claim 1, further comprising a polysoloxane (Pb) which contains the repeating unit represented by the formula (ia) but does not contain the structure represented by the formula (ia').

6. The composition according to claim 5, wherein said polysoloxane (Pb) further contains the repeating unit represented by said formula (ib).

7. The composition according to claim 1, wherein said polysoloxane (Pa) or (Pb) has a mass average molecular weight of 500 to 25,000.

8. The composition according to claim 1, wherein the number of said structures represented by the formula (ia') is 0.5 to 50% based on the total number of all the repeating units contained in the whole of the polysiloxanes.

9. The composition according to claim 1, wherein the summed number of both the repeating units (ia) serving as a part of (ia') in the polysiloxane (Pa) and those (ia) not connecting to another (ia) via said R is 60 mol % or more based on the total number of all the repeating units (ia) contained in the polysiloxane (Pa).

10. The composition according to claim 1, wherein the number of the structures represented by the following formula (ic):

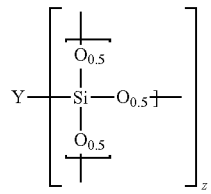

wherein
Y is a divalent or trivalent, linear, branched or cyclic, saturated or unsaturated aliphatic hydrocarbon group, or a divalent or trivalent aromatic hydrocarbon group,
in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon,
z is 2 or 3, and
Y is neither —$(CR'_2)_n$— or

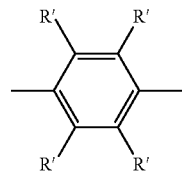

provided that
n is an integer of 1 to 3, and
each R' is independently hydrogen, methyl or ethyl is 25 mol % or less based on the total number of all the repeating units contained in the whole of the polysiloxanes.

11. The composition according to claim 1, wherein the containing ratio of said photoactive agent is 20 parts by mass or less based on the 100 parts by mass of the polysiloxane.

12. The composition according to claim 1, which is a positive type photosensitive composition.

13. The composition according to claim 1, which is a negative type photosensitive composition.

14. A pattern forming method comprising: applying the composition according to claim 1 on a substrate, image wise exposing it to light, and then developing it.

15. The method according to claim 14, further comprising: heating the composition after developing.

16. The method according to claim 15, which provides a pattern after heating having a taper angle selected in the range of 15 to 80°.

17. The method according to claim 14, wherein, if the applied composition is exposed to light in a 1:3 line-and-space pattern shape (5 μm line, 15 μm space) to form a pattern, the increasing ratio of the linewidth after heating for curing to that after developing is not larger than 35%.

18. The composition according to claim 12, wherein said photoactive agent is diazonaphthoquinone derivative.

19. The composition according to claim 13, wherein said photoactive agent is a compound selected from the group consisting of a photo acid generator, a photo base generator, a photo thermal acid generator and a photo thermal base generator.

20. The composition according to claim 1, wherein said polysiloxane (Pa) which contains a repeating unit represented by the following formula (ia'-2), (ia'-3-1) or (ia'-3-2):

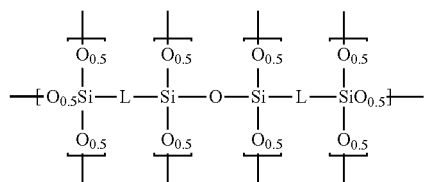
(ia'-2)

-continued

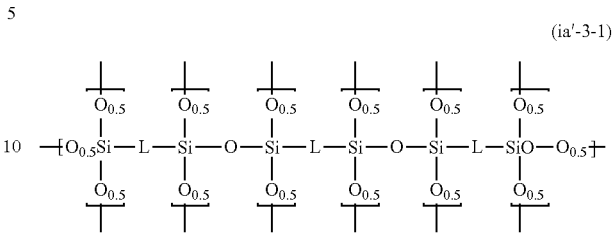
(ia'-3-1)

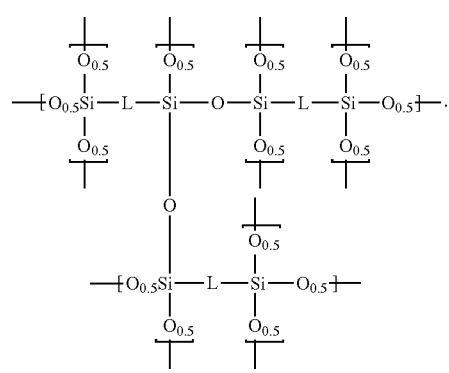
(ia'-3-2)

* * * * *